United States Patent
Louderback

(10) Patent No.: US 9,431,792 B2
(45) Date of Patent: Aug. 30, 2016

(54) METHOD AND APPARATUS FOR ACTIVE VOLTAGE REGULATION IN OPTICAL MODULES

(71) Applicant: Zephyr Photonics Inc., Zephyr Cove, NV (US)

(72) Inventor: Duane Louderback, Zephyr Cove, NV (US)

(73) Assignee: ZEPHYR PHOTONICS INC., Zephyr Cove, NV (US)

( * ) Notice: Subject to any disclaimer, the term of this patent is extended or adjusted under 35 U.S.C. 154(b) by 0 days.

(21) Appl. No.: 14/940,579

(22) Filed: Nov. 13, 2015

(65) Prior Publication Data

US 2016/0134081 A1    May 12, 2016

Related U.S. Application Data

(63) Continuation of application No. 14/135,200, filed on Dec. 19, 2013, now Pat. No. 9,190,809.

(60) Provisional application No. 61/747,302, filed on Dec. 29, 2012.

(51) Int. Cl.
*H01S 3/00* (2006.01)
*H01S 5/068* (2006.01)
(Continued)

(52) U.S. Cl.
CPC ......... *H01S 5/06804* (2013.01); *H01S 5/0427* (2013.01); *H05B 33/0842* (2013.01)

(58) Field of Classification Search
CPC .. H01S 5/06804; H01S 5/0085; H01S 5/183; H01S 5/06832; H01S 5/0607; H01S 5/02284; H01S 5/0425; H01S 5/0612; H01S 5/0683; H01S 5/0427; H01S 5/06258; H01S 5/06808; H01S 5/068; H02M 3/155; H02M 3/156; H02M 2003/1566; H05B 33/0884; H05B 33/0842; H05B 33/0815; H05B 33/0875; H05B 33/0812; H05B 33/0827; H05B 33/08; Y02B 20/343; Y02B 220/346; Y02B 220/325
USPC ............ 372/38.01, 38.02, 38.07; 257/79–82, 257/431, 433, 458, 461, E33.046; 438/57, 438/64, 65, 69, 23; 361/106; 315/158, 291, 315/308, 309
See application file for complete search history.

(56) References Cited

U.S. PATENT DOCUMENTS 4,767,168 A   8/1988   Grandy
4,811,361 A   3/1989   Bacou et al.
(Continued)

OTHER PUBLICATIONS

Dutton, Harry J.R., "Understanding Optical Communications," IBM, International Technical Support Organization, Retrieved from http://www.redbooks.ibm.com, 638 pages.
(Continued)

*Primary Examiner* — Jessica Stultz
*Assistant Examiner* — Delma R Forde
(74) *Attorney, Agent, or Firm* — Pillsbury Winthrop Shaw Pittman LLP

(57) ABSTRACT

A method and apparatus for active voltage regulation in optical modules utilize a voltage regulator to change the supply voltage provided to laser diode driver and receiver electronics to optimize module performance over temperature. The ambient temperature of the module is monitored. The outputs of the voltage regulator are controlled to provide voltages that are optimized with respect to temperature for the integrated circuits in the optical module. This control is implemented via a temperature sensitive feedback or a control input from a microcontroller with a temperature monitor input. The supply voltage is optimized to minimize the voltage required to achieve acceptable performance at a given temperature. Minimizing the supply voltage lengthens the lifetime of the integrated circuit and the optical module. The voltage regulator provides higher than standard supply voltages to a laser diode driver to compensate for higher laser voltage at low temperatures.

28 Claims, 2 Drawing Sheets

(51) Int. Cl.
*H05B 33/08* (2006.01)
*H01S 5/042* (2006.01)

(56) References Cited

U.S. PATENT DOCUMENTS

| | | | |
|---|---|---|---|
| 4,895,426 A | 1/1990 | Pinson | |
| 4,930,049 A | 5/1990 | Davenport et al. | |
| 5,212,750 A | 5/1993 | Wright | |
| 5,771,114 A | 6/1998 | Andersson et al. | |
| 5,844,236 A | 12/1998 | Wilson | |
| 6,052,248 A | 4/2000 | Reed et al. | |
| 6,052,632 A | 4/2000 | Iihoshi et al. | |
| 6,222,976 B1 | 4/2001 | Shahid | |
| 6,351,590 B1 | 2/2002 | Shahid | |
| 6,519,395 B1 | 2/2003 | Bevan et al. | |
| 6,631,490 B2 | 10/2003 | Shimoda | |
| 6,694,083 B2 | 2/2004 | Paradiso et al. | |
| 6,795,947 B1 | 9/2004 | Siegel et al. | |
| 6,978,319 B1 | 12/2005 | Rostoker et al. | |
| 6,989,776 B2 | 1/2006 | Tsang | |
| 7,000,177 B1 | 2/2006 | Wu et al. | |
| 7,030,789 B1 | 4/2006 | Cideciyan et al. | |
| 7,044,656 B1 | 5/2006 | Hofmeister et al. | |
| 7,071,851 B1 | 7/2006 | Blaum et al. | |
| 7,103,830 B1 | 9/2006 | Dong | |
| 7,120,778 B2 | 10/2006 | Zimmer | |
| 7,174,485 B2 | 2/2007 | Silvus | |
| 7,290,184 B2 | 10/2007 | Bruner et al. | |
| 7,307,556 B2 | 12/2007 | Lee | |
| 7,362,936 B2 | 4/2008 | Stark et al. | |
| 7,409,622 B1 | 8/2008 | Lu et al. | |
| 7,515,619 B2 | 4/2009 | Juluri | |
| 7,515,797 B2 | 4/2009 | Stark et al. | |
| 7,515,798 B2 | 4/2009 | Stark et al. | |
| 7,714,748 B1 | 5/2010 | Chaichanavong | |
| 7,949,025 B2 | 5/2011 | Olea | |
| 7,962,827 B2 | 6/2011 | Tang et al. | |
| 8,049,648 B2 | 11/2011 | Chaichanavong | |
| 8,055,977 B2 | 11/2011 | Ito | |
| 8,069,391 B1 | 11/2011 | Wu et al. | |
| 8,151,162 B2 | 4/2012 | Kanaoka et al. | |
| 8,161,347 B1 | 4/2012 | Kou | |
| 8,225,148 B2 | 7/2012 | Tang et al. | |
| 8,904,258 B2 | 12/2014 | Stark | |
| 9,020,344 B2 | 4/2015 | Stark | |
| 2004/0175077 A1 | 9/2004 | Weber | |
| 2005/0259571 A1 | 11/2005 | Battou | |
| 2006/0140564 A1 | 6/2006 | Upton | |
| 2006/0159462 A1 | 7/2006 | Aronson et al. | |
| 2006/0230425 A1 | 10/2006 | Shani et al. | |
| 2009/0135868 A1 | 5/2009 | Ishibashi | |
| 2010/0061726 A1 | 3/2010 | Barbarossa et al. | |
| 2011/0291578 A1 | 12/2011 | Philippbar et al. | |
| 2014/0185312 A1* | 7/2014 | Louderback | H05K 1/0203 362/553 |
| 2014/0186023 A1 | 7/2014 | Louderback | |
| 2015/0048754 A1* | 2/2015 | Davies | H05B 33/089 315/291 |
| 2015/0237700 A1* | 8/2015 | Woytowitz | H05B 33/0863 315/307 |

OTHER PUBLICATIONS

Papadimitriou, G.I., et al., "Optical Switching: Switch Fabrics, Techniques, and Architectures," Journal of Lightwave Technology, 21(2), 384-405, Feb. 2003.

Popplewell et al., "Peformance Aspects of Error Correcting Line Codes," Second IEEE National Conference on Telecommunications, pp. 47-52, 1989.

Small, B.A., et al., "The Current and Future State of Optical Switching Technologies as Related to the Data Vortex Photonic Switching Architecture," 6 pages.

Yang, Q. et al., "New Switch Fabric Architecture for Bursty Traffic," IEEE, 43-44, 2002.

* cited by examiner

METHOD AND APPARATUS FOR ACTIVE VOLTAGE REGULATION IN OPTICAL MODULES

CROSS REFERENCE TO RELATED APPLICATION

This application is a continuation of, and claims priority and benefits of, U.S. patent application Ser. No. 14/135,200 filed Dec. 19, 2013, which further claims the benefit of U.S. Provisional Application Ser. No. 61/747,302 entitled "Method and Apparatus for Active Voltage Regulation in Optical Modules" filed Dec. 29, 2012. The above-referenced applications are hereby incorporated by reference in their entirety.

BACKGROUND OF THE INVENTION

This invention relates to a method and apparatus for voltage regulation in optical modules, particularly to optimize performance and extend the operating temperature range.

Voltage regulators are often used in a variety of electronics applications. However, voltage regulators are not typically used in optical modules, such as transceivers. When voltage regulators are utilized, they are used to provide power isolation, noise filtering, and/or to regulate a nominally fixed input voltage to a supply voltage required by the electronics in the optical module. Therefore, a need exists for active voltage regulation to adjust supply voltages for electronics in an optical module to optimize performance over temperature.

SUMMARY OF THE INVENTION

A method and apparatus for active voltage regulation in optical modules having a voltage regulator to change the supply voltage provided to laser diode driver and receiver electronics to optimize module performance over temperature is provided. The ambient temperature of the module may be monitored, and the outputs of the voltage regulator may be controlled to provide voltages that may be optimized with respect to temperature for one or more of the integrated circuits in the optical module. This control may be implemented via a temperature sensitive feedback or via a control input from a microcontroller with a temperature monitor input. The supply voltage may be optimized to minimize the voltage required to achieve acceptable performance at a given temperature. Minimizing the supply voltage to an integrated circuit may also lengthen the lifetime of the integrated circuit, and therefore the lifetime of the optical module. In addition, the voltage regulator may be used to provide higher than standard supply voltages to a laser diode driver to compensate for higher laser, particularly vertical-cavity surface-emitting laser (VCSEL), voltage at low temperatures.

To this end, an embodiment of an optical module apparatus having active voltage regulation to adjust supply voltages for electronics in an optical module to optimize performance over temperature is provided. The apparatus may have a combination of one or more semiconductor light sources, one or more photodetectors, and zero or more optical modulators.

The apparatus may have one or more optical fibers and optics to couple light from the semiconductor light sources into the optical fibers and from the optical fibers onto the photodetectors. The apparatus may also have driver and interface electronics, amplifiers, and microcontrollers. The apparatus may have a temperature monitor having an output and a voltage regulator with one or more outputs. Finally, the apparatus may have voltage regulator control electronics configured to adjust outputs of the voltage regulator with respect to the output of the temperature monitor.

In an embodiment, the semiconductor light source may be one or more of the following: a light emitting diode (LED), a vertical-cavity surface-emitting laser (VCSEL), a Fabry-Perot laser and a distributed feedback (DFB) laser.

In an embodiment, the photodetector may be one or more of the following: a p-l-n photodetector, an avalanche photodetector, a metal-semiconductor-metal (MSM) photodetector and a traveling wave photodetector.

In an embodiment, the semiconductor light source may be directly modulated or may be modulated using an optical modulator.

In an embodiment, the temperature monitor may be a thermistor or a thermocouple.

In an embodiment, the optical fiber may be a single mode fiber or a multimode fiber.

In an embodiment, the optical module may be an optical transceiver, an optical transmitter or an optical receiver.

In an embodiment, the optical module may transmit digital data and/or analog data. In an embodiment, the optical module may be used to implement data interconnects for control systems or for clock signal distribution.

In an embodiment, the optical module may be an optical interrogator.

In an embodiment, the voltage regulator enables the optical module to operate on different supply voltages.

In an embodiment, the voltage regulator may stabilize the voltage output and may reduce supply voltage ripple.

In an embodiment, the output voltages of the voltage regulator may be controlled to optimize performance of the optical module over temperature.

In an embodiment, the output voltages of the voltage regulator may be adjusted to provide the minimum supply voltage required at a given temperature by different electronics enabling power consumption to be minimized.

In an embodiment, the output voltages of the voltage regulator may be adjusted to provide the minimum supply voltage required at a given bit rate by different electronics enabling power consumption to be minimized.

In an embodiment, the output voltages of the voltage regulator may be adjusted to provide the minimum supply voltage required at a given temperature by different electronics enabling the optical module lifetime to be maximized. In an embodiment, the output voltages of the voltage regulator may be adjusted to provide the minimum supply voltage required at a given bit rate by different electronics enabling the optical module lifetime to be maximized.

In an embodiment, the output voltage of the voltage regulator used as the supply voltage for the laser diode driver may be increased at low temperatures to compensate for higher VCSEL drive voltages at low temperatures.

In an embodiment, the output voltage of the voltage regulator used as the supply voltage for the laser diode driver may be adjusted to ensure sufficient voltage headroom at given drive conditions.

In an embodiment, the output of the temperature monitor may be used as a control input by the voltage regulator control electronics.

In an embodiment, the voltage regulator control electronics adjust the voltage output settings of the voltage regulator.

In an embodiment, the voltage regulator control electronics and the temperature monitor may be the same components.

In an embodiment, the voltage regulator outputs may be controlled by the voltage regulator control electronics to produce different voltages for different electronics in the optical module.

In an embodiment, the temperature monitor may be integrated in the electronics.

In another embodiment of the invention, a method of regulating voltage in an optical module is provided. The method may have the steps of: providing one or more semiconductor light sources, one or more photodetectors, and zero or more optical modulators; coupling light from the semiconductor light source into an optical fiber and from the optical fiber onto the photodetector; monitoring the temperature of the optical module; providing a voltage regulator having an output; and adjusting the output of the voltage regulator with respect to the temperature of the optical module.

In an embodiment, the method may have the step of providing the output of the voltage regulator to the semiconductor light source as a drive voltage.

In an embodiment, the method may have the step of providing the output of the voltage regulator to the photodetector as a bias voltage.

In an embodiment, the method may have the step of controlling the output of the voltage regulator outputs to produce different voltages for different electronics in the optical module.

In an embodiment, the method may have the step of using the output of the temperature monitor as a control input for adjusting the voltage output settings of the voltage regulator.

In an embodiment, the method may have the step of adjusting the output voltages of the voltage regulator to provide a minimum supply voltage required at a given bit rate.

In an embodiment, the method may have the step of adjusting the output voltages of the voltage regulator to provide a minimum supply voltage required at a temperature.

In an embodiment, the method may have the step of adjusting the output voltages of the voltage regulator to optimize performance of the optical module over temperature.

DETAILED DESCRIPTION OF THE INVENTION

A method and apparatus for implementing active voltage regulation in optical modules such as transceivers are provided. In the preferred implementation, a voltage regulator may be used to provide a supply voltage that may be adjusted with temperature to integrated circuits within the optical module to optimize performance of the optical module. The voltage regulator circuit may provide more than one individually controlled supply voltages if different integrated circuits in the optical module require different voltages at a given temperature. By controlling the supply voltages for integrated circuits in the optical module such as laser diode drivers, transimpedance amplifiers, and microcontrollers, the performance of each of these components, as well as other components such as VCSELs, may be optimized to reduce power consumption and improve module lifetime. In addition, the voltage regulator may provide a stable voltage supply at higher than nominal input levels for the laser diode driver at low temperatures, enabling the laser diode driver to drive VCSELs at low temperatures where the VCSEL voltage would be too high without this control. At higher temperatures, the supply voltage to the laser diode driver may be reduced to improve the lifetime of the laser diode driver. In addition, the voltage regulator may also be used to implement more common functions such as voltage step-down and noise filtering. The voltage regulator may also be designed to accommodate a range of input voltages.

Figure 1:
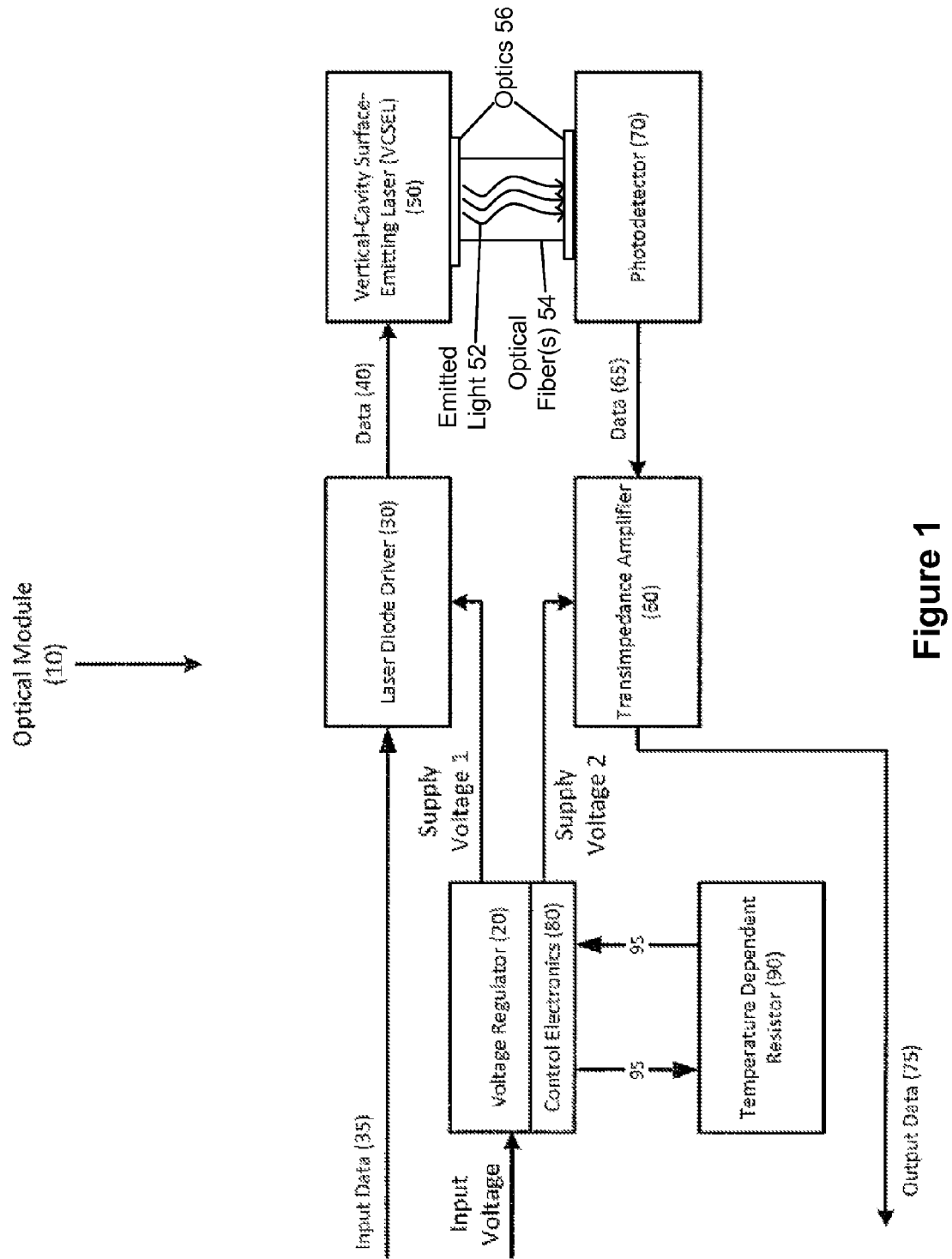
FIG. 1 is a schematic diagram of an embodiment of an optical module with active voltage regulation wherein the control of the voltage regulator over temperature may be implemented with a temperature dependent resistance.
Figure 2:
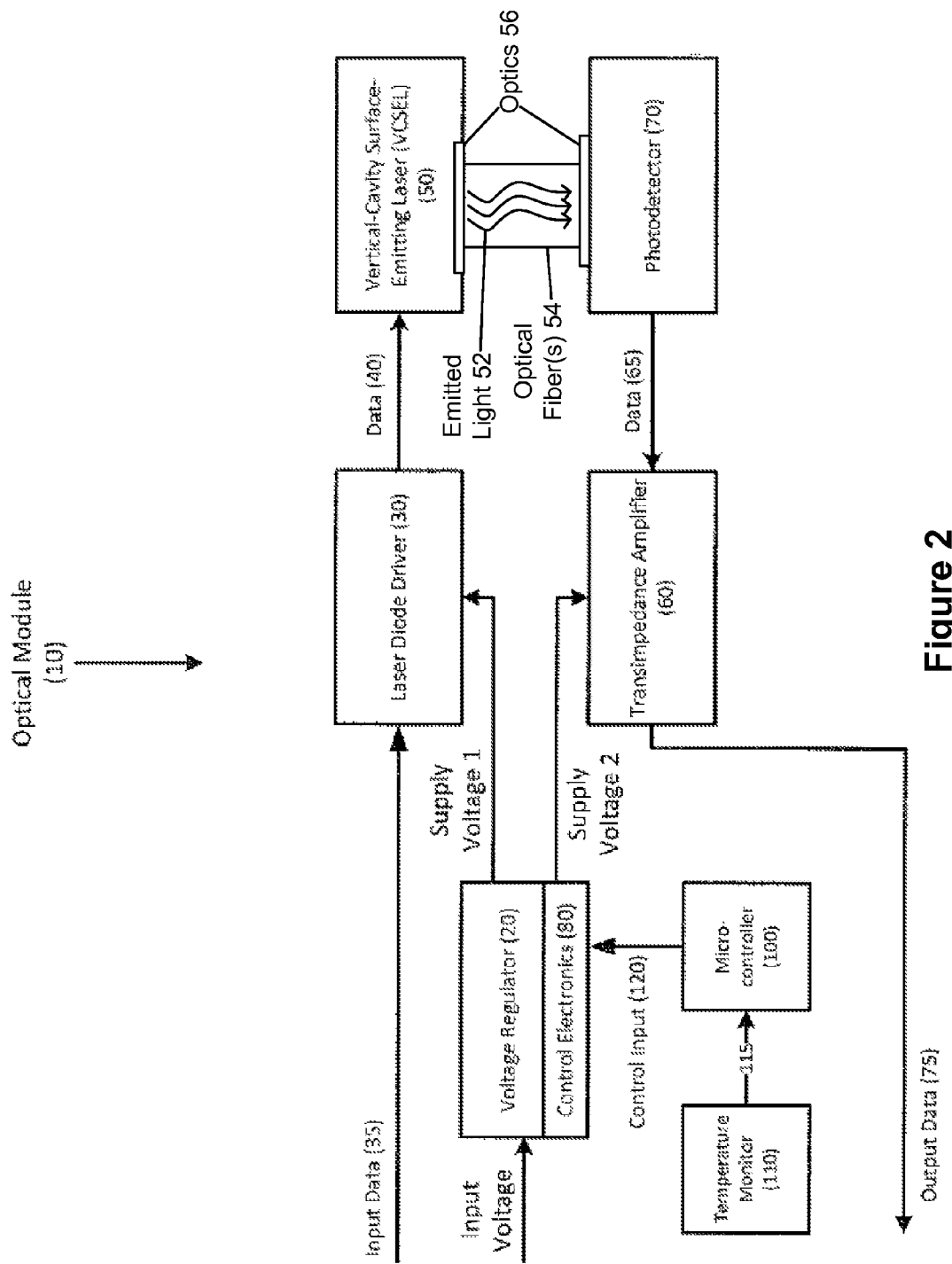
FIG. 2 is a schematic diagram of an embodiment of an optical module with active voltage regulation wherein the control of the voltage regulator over temperature may be implemented using a microcontroller with a temperature monitor input.

The control of the voltage regulator over temperature may be implemented in a variety of ways. Referring now to the Figures where like numerals indicate like elements, a schematic diagram of an embodiment of an optical module 10 with active voltage regulation is shown in FIG. 1. The control of the voltage regulator 20 over temperature may be implemented with a temperature dependent resistance 90. FIG. 2 is a schematic diagram of another embodiment of an optical module 10 with active voltage regulation. The control of the voltage regulator 20 over temperature may be implemented using a microcontroller 100 with a temperature monitor input 110.

For relatively simple monotonic temperature adjustment of the supply voltages, the preferred implementation may use a temperature dependent feedback resistor 90 in the voltage regulator circuit as shown in FIG. 1. For designs that require more complex adjustment of the supply voltages versus temperature, the voltage regulator 20 may be controlled with the microcontroller 100 that obtains the temperature of the optical module 10 from the temperature monitor 110 such as a thermistor, as shown in FIG. 2.

FIG. 1 illustrates a schematic diagram of an embodiment of the optical module 10 with active voltage regulation. The optical module 10 may be used to implement data interconnects for control systems and/or for clock signal distribution. The optical module 10 may be an optical interrogator.

The optical module 10 may have the voltage regulator 20. The control of the voltage regulator 20 over temperature may be implemented with the temperature dependent resistance 90. The voltage regulator 20 may have an Input Voltage and outputs Supply Voltage 1 and Supply Voltage 2. The voltage regulator 20 may enable the optical module 10 to operate on different supply voltages. For example, Supply Voltage 1 may be an output supply voltage provided by the voltage regulator 20. Supply Voltage 1 may be connected as the supply voltage for a laser diode driver 30. Further, Supply Voltage 1 may be adjusted to ensure sufficient voltage headroom at given drive conditions.

The optical module 10 may have an input for Input Data 35. The laser diode driver 30 may take Input Data 35 and output Data 40 to a vertical-cavity surface-emitting laser (VCSEL) 50. At low temperatures, Supply Voltage 1 may be increased to compensate for higher VCSEL drive voltages at low temperatures. Supply Voltage 2 may be connected as a supply voltage for a transimpedance amplifier 60. The transimpedance amplifier 60 may receive Data 65 from a photodetector 70. The transimpedance amplifier 60 may provide an output of Output Data 75 from the optical module 10. The optical module 10 may have one or more optical fibers 54 connected between the VCSEL 50 and the photo-detector 70 of the same or different optical modules. Optics 56 may also be provided to facilitate coupling light 52 into and/or out of the one or more optical fibers 54.

Control of the voltage regulator 20 over a range of operating temperatures may be implemented with control electronics 80 and/or the temperature dependent resistance/resistor 90. The temperature dependent resistor 90 may be implemented by a thermistor, a thermocouple or the like. Further, the voltage regulator 20 may stabilize the voltage output and may reduce supply voltage ripple.

The output voltages of the voltage regulator 20 may be controlled to optimize performance of the optical module 10 over a range of operating temperatures. The output voltages may also be controlled to minimize power consumption of the optical module 10. Moreover, the output voltages may also be controlled to maximize the lifetime of the optical module 10. For example, the output voltages of the voltage regulator 20 may be adjusted to provide the minimum supply voltage required at a given temperature by different electronics enabling power consumption to be minimized. Also, the output voltages of the voltage regulator 20 may be adjusted to provide the minimum supply voltage required at a given bit rate by different electronics.

Also, the output voltages of the voltage regulator 20 may be adjusted to provide the minimum supply voltage required at a given temperature by different electronics enabling the lifetime of the optical module 10 to be maximized. Similarly, the output voltages of the voltage regulator may be adjusted to provide the minimum supply voltage required at a given bit rate by different electronics enabling the lifetime of the optical module 10 to be maximized.

The ambient temperature of the optical module 10 may be monitored, and the outputs of the voltage regulator 20 may be controlled to provide voltages that may be optimized with respect to temperature for one or more of the integrated circuits in the optical module 10. This control may be implemented via a temperature sensitive feedback 95 implemented with the control electronics 80 and the temperature dependent resistor 90 as shown in FIG. 1.

FIG. 2 illustrates a schematic diagram of another embodiment of an optical module with active voltage regulation. Control of the voltage regulator 20 over a range of temperatures may be implemented with the microcontroller 100 and the temperature monitor 110. Such an embodiment may be preferred where more complex adjustment of the supply voltages with respect to temperature may be required. The voltage regulator 20 may be controlled with the microcontroller 100. The microcontroller 100 may obtain the temperature of the optical module 10 from the temperature monitor 110. The temperature monitor 110 may be a thermistor. The temperature monitor 110 may provide an output 115 to the microcontroller 100 that may provide the control input 120 to the voltage regulator control electronics 80. The output 115 of the temperature monitor 110 may also provide the control input 120 to the voltage regulator control electronics 80. The voltage regulator control electronics 80 may adjust the voltage output settings of the voltage regulator 20. In an embodiment of the invention, the voltage regulator control electronics 80 and the temperature monitor 110 may be the same component. Further, the temperature monitor 110 may be integrated in the control electronics 80. The voltage regulator outputs, for example, Supply Voltage 1 and Supply Voltage 2, may be controlled by the voltage regulator control electronics 80 to produce different voltages for different electronics in the optical module 10. Although only two supply voltages are shown in the drawings, additional supply voltages may be provided by the voltage regulator 20 in other embodiments of the invention.

The ambient temperature of the optical module 10 may be monitored, and the outputs of the voltage regulator 20 may be controlled to provide voltages that may be optimized with respect to temperature for one or more of the integrated circuits in the optical module 10. This control may be implemented via the temperature sensitive feedback as shown in FIG. 1 or via the control input 120 from the microcontroller 100. The temperature monitor 110 may provide the output 115 to the microcontroller 100 that may provide the control input 120 to the voltage regulator control electronics 80 as shown in FIG. 2.

It should be understood that various changes and/or modifications to the presently preferred embodiments described herein will be apparent to those skilled in the art. Such changes and/or modifications may be made without departing from the spirit and/or scope of the present invention and without diminishing its attendant advantages. It is, therefore, intended that such changes and/or modifications be covered by the appended claims.

The invention claimed is:

1. An optical module apparatus, comprising:
   one or more semiconductor light sources to emit light;
   a laser diode driver coupled to the one or more semiconductor light sources to drive the one or more semiconductor light sources;
   a temperature monitor configured to generate an output indicative of a temperature of the optical module apparatus;
   a voltage regulator configured to generate output voltages and coupled to the laser diode driver to provide a supply voltage to the laser diode driver to drive the one or more semiconductor light sources, wherein the supply voltage to the laser diode driver is included in the output voltages;
   voltage regulator control electronics configured to adjust the output voltages of the voltage regulator based at least in part on the output of the temperature monitor; and
   a microcontroller including an input to receive the output of the temperature monitor and configured to provide a control input to the voltage regulator control electronics based at least in part on the received output of the temperature monitor.

2. The apparatus of claim 1 wherein the one or more semiconductor light sources comprise a light emitting diode (LED), a vertical-cavity surface-emitting laser (VCSEL), a Fabry-Perot laser or a distributed feedback (DFB) laser.

3. The apparatus of claim 1 wherein the temperature monitor comprises a thermistor or a thermocouple.

4. The apparatus of claim 1 wherein the voltage regulator is configured to enable the optical module apparatus to operate on different supply voltages.

5. The apparatus of claim 1 wherein the voltage regulator is configured to stabilize the output voltages and reduce supply voltage ripple.

6. The apparatus of claim 1 wherein the voltage regulator control electronics is configured to control the output voltages of the voltage regulator to adjust performance of the optical module over temperature.

7. The apparatus of claim 1 wherein the voltage regulator control electronics is configured to adjust the output voltages of the voltage regulator to reduce supply voltage at a given temperature to reduce power consumption by the optical module apparatus.

8. The apparatus of claim 1 wherein the voltage regulator control electronics is configured to adjust the output voltages of the voltage regulator to reduce supply voltage at a given bit rate of the optical module apparatus to reduce power consumption by the optical module apparatus.

9. The apparatus of claim 1 wherein the temperature monitor is integrated with voltage regulator control electronics, the microcontroller or the laser diode driver.

10. An optical module apparatus, comprising:
one or more photodetectors to detect light emitted from one or more semiconductor light sources;
a transimpedance amplifier coupled to the one or more photodetectors to receive data from the one or more photodetectors;
a temperature monitor configured to generate an output indicative of a temperature of the optical module apparatus;
a voltage regulator configured to generate output voltages and coupled to the transimpedance amplifier to provide a supply voltage to the transimpedance amplifier, wherein the supply voltage to the transimpedance amplifier is included in the output voltages;
voltage regulator control electronics configured to adjust the output voltages of the voltage regulator based at least in part on the output of the temperature monitor; and
a microcontroller including an input to receive the output of the temperature monitor and configured to provide a control input to the voltage regulator control electronics based at least in part on the received output of the temperature monitor.

11. The apparatus of claim 10 wherein the one or more photodetectors comprise a p-i-n photodetector, an avalanche photodetector, a metal-semiconductor-metal (MSM) photodetector or a traveling wave photodetector.

12. The apparatus of claim 10 wherein the voltage regulator is configured to enable the optical module apparatus to operate on different supply voltages.

13. The apparatus of claim 10 wherein the voltage regulator is configured to stabilize the output voltages and reduce supply voltage ripple.

14. The apparatus of claim 10 wherein the voltage regulator control electronics is configured to control the output voltages of the voltage regulator to adjust performance of the optical module over temperature.

15. The apparatus of claim 10 wherein the voltage regulator control electronics is configured to adjust the output voltages of the voltage regulator to reduce supply voltage at a given temperature to reduce power consumption by the optical module apparatus.

16. The apparatus of claim 10 wherein the voltage regulator control electronics is configured to adjust the output voltages of the voltage regulator to reduce supply voltage at a given bit rate of the optical module apparatus to reduce power consumption by the optical module apparatus.

17. The apparatus of claim 10 wherein the temperature monitor is integrated with voltage regulator control electronics, the microcontroller, or the transimpedance amplifier.

18. The apparatus of claim 10 wherein the temperature monitor comprises a thermistor or a thermocouple.

19. A method of adjusting voltage in an optical module, the method comprising:
providing one or more semiconductor light sources in the optical module, wherein a laser diode driver is coupled to the one or more semiconductor light sources to drive the one or more semiconductor light sources;
optically coupling light from the one or more semiconductor light sources to an optical fiber;
monitoring, from a temperature monitor, a temperature of the optical module based on an output generated by the temperature monitor indicative of the temperature of the optical module apparatus;
providing, from a voltage regulator, an output including one or more supply voltages to the laser diode driver to drive the one or more semiconductor light sources;
using voltage regulator control electronics to adjust the output of the voltage regulator based at least in part on the monitoring of the temperature of the optical module; and
providing, from a microcontroller that received the output of the temperature monitor, a control input to the voltage regulator based at least in part on the output of the temperature monitor received from the temperature monitor.

20. The method of claim 19 further comprising:
using monitoring of the temperature in a feedback circuit for adjusting the output of the voltage regulator.

21. The method of claim 19 further comprising:
adjusting the output of the voltage regulator to adjust supply voltage to the laser diode driver at a given temperature provided based on the output of the voltage regulator.

22. The method of claim 19 further comprising:
adjusting the output of the voltage regulator to adjust performance of the optical module over a range of temperature.

23. The method of claim 21 further comprising:
adjusting the output of the voltage regulator to adjust supply voltage to the laser diode driver at a given bit rate provided based on the output of the voltage regulator.

24. A method of adjusting voltage in an optical module, the method comprising:
providing one or more photodetectors in the optical module to detect light emitted from one or more semiconductor light sources;
optically coupling light from an optical fiber to the one or more photodetectors;
monitoring, from a temperature monitor, a temperature of the optical module based on an output generated by the temperature monitor indicative of the temperature of the optical module;
providing, from a voltage regulator, an output including one or more supply voltages to a transimpedance amplifier to provide a supply voltage to the transimpedance amplifier;
using voltage regulator control electronics to adjust the output of the voltage regulator based at least in part on the monitoring of the temperature of the optical module; and
providing, from a microcontroller that received the output of the temperature monitor, a control input to the voltage regulator based at least in part on the output of the temperature monitor received from the temperature monitor.

25. The method of claim 24 further comprising:
using monitoring of the temperature in a feedback circuit for adjusting the output of the voltage regulator.

26. The method of claim 24 further comprising:
adjusting the output of the voltage regulator to adjust supply voltage to the transimpedance amplifier at a given temperature provided based on the output of the voltage regulator.

27. The method of claim 24 further comprising:
adjusting the output of the voltage regulator to adjust performance of the optical module over a range of temperature.
28. The method of claim 24 further comprising:
adjusting the output of the voltage regulator to adjust supply voltage to the transimpedance amplifier at a given bit rate provided based on the output of the voltage regulator.

* * * * *